(12) United States Patent
Hyde et al.

(10) Patent No.: US 8,879,219 B2
(45) Date of Patent: *Nov. 4, 2014

(54) SYSTEMS AND METHODS FOR GROUNDING POWER LINE SECTIONS TO CLEAR FAULTS

(71) Applicant: Searete LLC, Bellevue, WA (US)

(72) Inventors: Roderick A. Hyde, Redmond, WA (US); Muriel Y. Ishikawa, Livermore, CA (US); Lowell L. Wood, Jr., Bellevue, WA (US); Victoria Y. H. Wood, Livermore, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/967,532

(22) Filed: Aug. 15, 2013

(65) Prior Publication Data

US 2013/0329326 A1 Dec. 12, 2013

Related U.S. Application Data

(63) Continuation of application No. 13/609,849, filed on Sep. 11, 2012, now Pat. No. 8,537,511, which is a continuation of application No. 12/460,456, filed on Jul. 17, 2009, now Pat. No. 8,289,665.

(51) Int. Cl.
*H02H 7/00* (2006.01)
*H02H 3/06* (2006.01)
*H02H 7/26* (2006.01)
*H02H 3/02* (2006.01)

(52) U.S. Cl.
CPC ............. *H02H 3/066* (2013.01); *H02H 3/021* (2013.01); *H02H 7/26* (2013.01)
USPC ........................................................ 361/54

(58) Field of Classification Search
USPC ........................................................ 361/54
See application file for complete search history.

(56) References Cited

U.S. PATENT DOCUMENTS

| | | | |
|---|---|---|---|
| 4,390,835 A | | 6/1983 | Elkateb et al. |
| 4,477,855 A | * | 10/1984 | Nakayama et al. ............. 361/54 |
| 5,343,155 A | | 8/1994 | Kejariwal et al. |
| 5,543,597 A | | 8/1996 | Watanabe et al. |
| 5,638,524 A | | 6/1997 | Kiuchi et al. |
| 5,903,155 A | | 5/1999 | Bjorklund |
| 6,822,457 B2 | | 11/2004 | Borchert et al. |

* cited by examiner

*Primary Examiner* — Stephen W Jackson
(74) *Attorney, Agent, or Firm* — Foley & Lardner LLP

(57) ABSTRACT

Systems and methods for dynamically clearing faults in a power transmission line involve automatically terminating ends of a section of the power line while preserving electrical and/or physical continuity of the power line. The terminating of the ends is reversed at about voltage zero-crossings in the power line to clear a fault.

20 Claims, 5 Drawing Sheets

410
Fault sensor network

420
Grounding devices coupled to ends of power transmission line sections

430
Controller

FIG. 5

Method 500

510
Detect, anticipate or predict a power line fault and its location

520
Crowbar "faulted" section of line to ground while maintaining electrical and physical continuity of end line sections

530
Reverse crowbaring of "faulted" section of line at about voltage zero-crossings in power line

SYSTEMS AND METHODS FOR GROUNDING POWER LINE SECTIONS TO CLEAR FAULTS

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

The present application constitutes a continuation of U.S. patent application Ser. No. 13/609,849, entitled SYSTEMS AND METHODS FOR GROUNDING POWER LINE SECTIONS TO CLEAR FAULTS, naming RODERICK A. HYDE, MURIEL Y. ISHIKAWA, LOWELL L. WOOD, JR. and VICTORIA Y. H. WOOD as inventors, filed Sep. 11, 2012, which is currently co-pending or is an application of which a currently co-pending application is entitled to the benefit of the filing date, and which is a continuation of U.S. patent application Ser. No. 12/460,456, entitled SYSTEMS AND METHODS FOR GROUNDING POWER LINE SECTIONS TO CLEAR FAULTS, naming RODERICK A. HYDE, MURIEL Y. ISHIKAWA, LOWELL L. WOOD, JR. and VICTORIA Y. H. WOOD as inventors, filed Jul. 7, 2009.

RELATED APPLICATIONS

U.S. patent application Ser. No. 12/589,051, entitled SYSTEMS AND METHODS FOR GROUNDING POWER LINE SECTIONS TO CLEAR FAULTS, naming RODERICK A. HYDE, MURIEL Y. ISHIKAWA, LOWELL L. WOOD, JR. and VICTORIA Y. H. WOOD as inventors, filed Oct. 16, 2009, is related to the present application.

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

BACKGROUND

Power utilities generate electrical power at remote plants and deliver electricity to residential, business or industrial customers via transmission networks and distribution grids. The power utilities may transmit large quantities of electric power over long distance transmission networks from power generating plants to regional substations, which then supply the power to local customers using the distribution grids.

The transmission networks and/or distribution grids may include overhead power transmission lines suspended by towers or poles. The transmission lines may, for example, be bare wire conductors made of aluminum. Instead of aluminum, copper wires may be used in medium-voltage distribution and low-voltage connections to customer premises.

Power loss in transmission lines (in particular, in long distance transmission lines) is a significant component of the cost of electricity. This power loss is a decreasing function of transmission voltage. Therefore, power is typically first transmitted as high voltage transmissions from the remote power plants to geographically diverse substations. The most common transmission voltages in use are 765, 500, 400, 220 kV, etc. Transmission voltages higher than 800 kV are also in use. From the substations, the received power is sent using cables or "feeders" to local transformers that further reduce the voltage. Voltages below 69 kV are termed subtransmission or distribution voltages. The outputs of the transformers are connected to a local low voltage power distribution grid that can be tapped directly by the customers.

Any electric power transmission and distribution system ("delivery system"), which includes different complex interacting elements, in operation is susceptible to disturbances, surges and faults. The faults may, for example, include open circuit faults, short circuit faults, earth leakage faults and insulation breakdown. The faults may be produced as a result of, for example, lightning strikes, mechanical loading by ice and/or wind, operation of certain electrical equipment, electromagnetic surges, static electricity, and/or induced voltages. A fault often results in overvoltage transients, travelling wave pulses and uncontrolled release of energy (e.g., arcing), which can cause further damage to the system and attached loads. Accordingly, electric power delivery systems are often provided with surge protectors/shunts (e.g., a crowbar circuit) to divert energy to ground or neutral. Further, the electric power delivery equipment may be then de-energized to allow for fault clearing, recovery or repair.

The surge protectors may include circuitry that is responsive to a rate of change of a current or voltage to prevent a rise above a predetermined value of the current or voltage. In power transmission systems, surge protector circuits may allow the voltage on a transmission line conductor to rise very rapidly when a lightning strike or other surge occurs on the line, until the breakdown voltage of the gas tube, triac, or other crowbar device goes conductive, and the impedance from the conductor to ground or to some other reference potential reduces very rapidly.

The term "switchgear" is commonly used, in the context of electric power delivery systems, to refer to the combination of electrical disconnects, fuses, relays, and/or circuit breakers used to isolate electrical equipment. Switchgear is used both to de-energize equipment to allow work to be done and to clear faults downstream.

Consideration is now being given to solutions for interrupting fault currents and de-energizing equipment in high voltage electrical power delivery systems.

SUMMARY

Approaches for clearing faults in an AC power line are provided.

In an exemplary approach, the effects of a ground-fault on a section of a transmission line are reduced by crowbaring the section to ground at two different ends on either side of the fault. The crowbaring action may be expected to raise local ground voltage to that of the line, eliminating voltage-drop (e.g., arc) across the fault. The crowbaring action may be reversed afterwards (e.g., one to a few power cycles later) at voltage zero-crossings to clear the fault. The electrical and/or physical continuity of the power line may be preserved through the crowbaring and reversal actions. The crowbaring action may be conducted in response to an actual line fault, impending line fault and/or a predicted line fault.

An exemplary system for clearing power line faults includes a crowbar arranged to switchably ground first and second ends of a section of a live power line using fast acting grounding switches. The crowbar may be arranged to switchably ground the first and second ends of a section of a live power line without breaking or open circuiting either the first or the second end of the section of the live power line and preserving the electrical and/or physical continuity of the live power line. The crowbar is arranged to switchably ground the first and second ends of the section of the live power line on a power cycle or sub-cycle time scale. The crowbar may be arranged to switchably ground the first and second ends of the section of the live power line synchronously and/or substantially simultaneously. The crowbar may be further arranged to un-ground the grounded first and second ends of the section of the live power line after a suitable time interval to clear the fault and restore power line operations.

The system may include circuits/sensors/processors configured to detect and locate an actual line fault, impending line fault and/or a predicted line fault. The circuits/sensors/processors may be configured to measure power line events and characteristics including power line voltages and/or currents, proximate electromagnetic fields, leakage currents across an insulator, etc.

BRIEF DESCRIPTION OF THE FIGURES

In the accompanying drawings:

FIG. 4 is a block diagram illustrating a system for grounding a faulted section of transmission power line while maintaining electrical and physical continuity of the line, in accordance with the principles of the solutions described herein; and FIG. 5 is a flow diagram illustrating an exemplary method for grounding a faulted section of transmission power line while maintaining electrical and physical continuity of the line, in accordance with the principles of the solutions described herein.

Throughout the figures, unless otherwise stated, the same reference numerals and characters are used to denote like features, elements, components, or portions of the illustrated embodiments.

DESCRIPTION

Systems and methods for clearing faults on A.C. power lines in an electrical power delivery system are provided.

In the following description of exemplary embodiments, reference is made to the accompanying drawings, which form a part hereof. It will be understood that embodiments described herein are exemplary, but are not meant to be limiting. Further, it will be appreciated that the solutions described herein can be practiced or implemented by other than the described embodiments. Modified embodiments or alternate embodiments may be utilized, in the spirit and scope of the solutions described herein.

Figure 1:
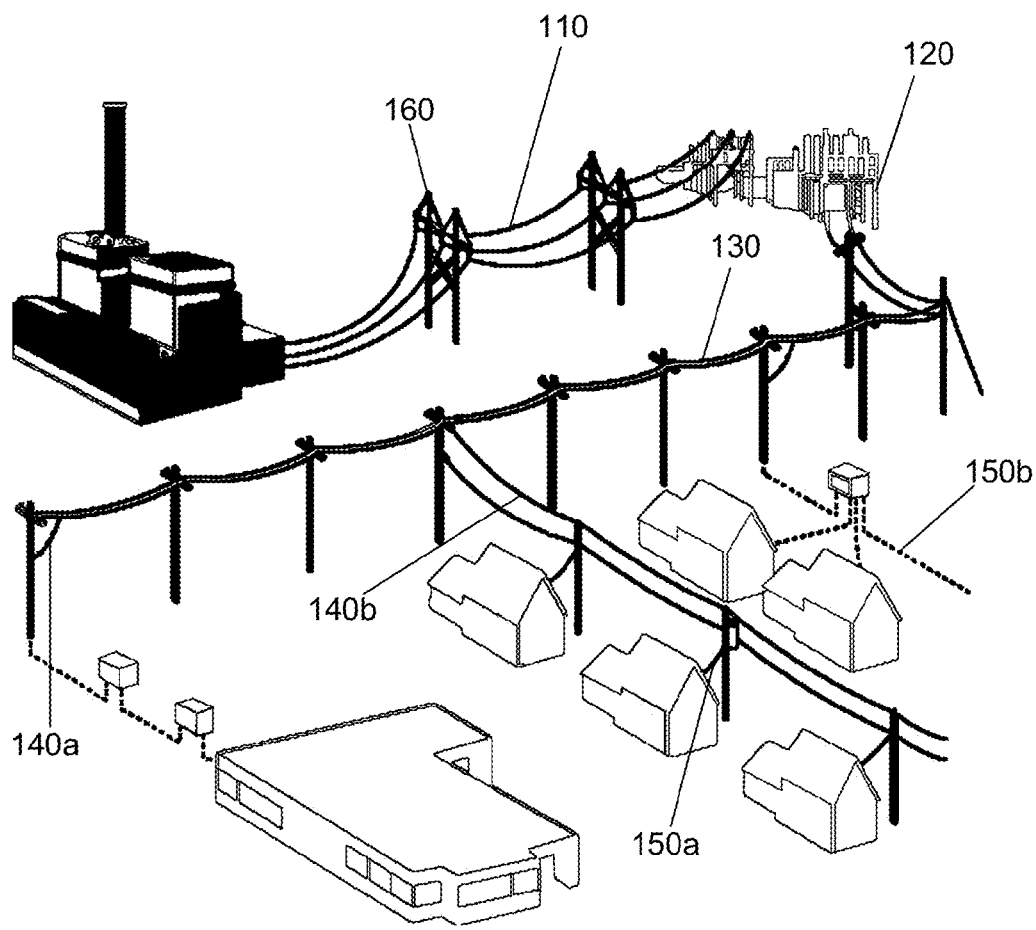
FIG. 1 is a schematic illustration of an exemplary electrical power delivery system.

FIG. 1 shows a simplified representation of an electrical power transmission and distribution system (e.g., electrical power delivery system 100). In system 100, electricity is generated at a power plant (e.g. by generator A) is stepped up in voltage and sent out on high voltage transmission lines 110 to substation 120. At substation 120, step-down transformers adjust the electrical voltage so it can be routed over main distribution lines 130 to large subdivisions and large commercial customers. Overhead (140a) or underground (140b) local distribution lines are fed from main distribution lines 130 to deliver power to smaller neighborhoods and businesses. Similarly, overhead (150a) or underground (150b) service lines then deliver power to individual customer locations. System 100 may, for example, deliver multiple-phase power.

It will be understood that in practice, system 100 may include many substations 120 and that high voltage transmission lines 110 may extend over several hundred of miles supported by a large number of transmission towers 160. System 100 may also include diagnostic equipment (e.g., for fault detection or monitoring) and protective switchgear (e.g., circuit breakers, reclosers and switchers, relays, surge protectors, lightning arresters, etc.) placed through out the system (e.g., at towers, substations, generators, transformers, etc.).

System 100 may, for example, include circuit breakers and automated grounding devices disposed at suitable intervals along transmission lines 110, which are arranged to interrupt line current and to ground conductors at suitable points.

Figure 2:
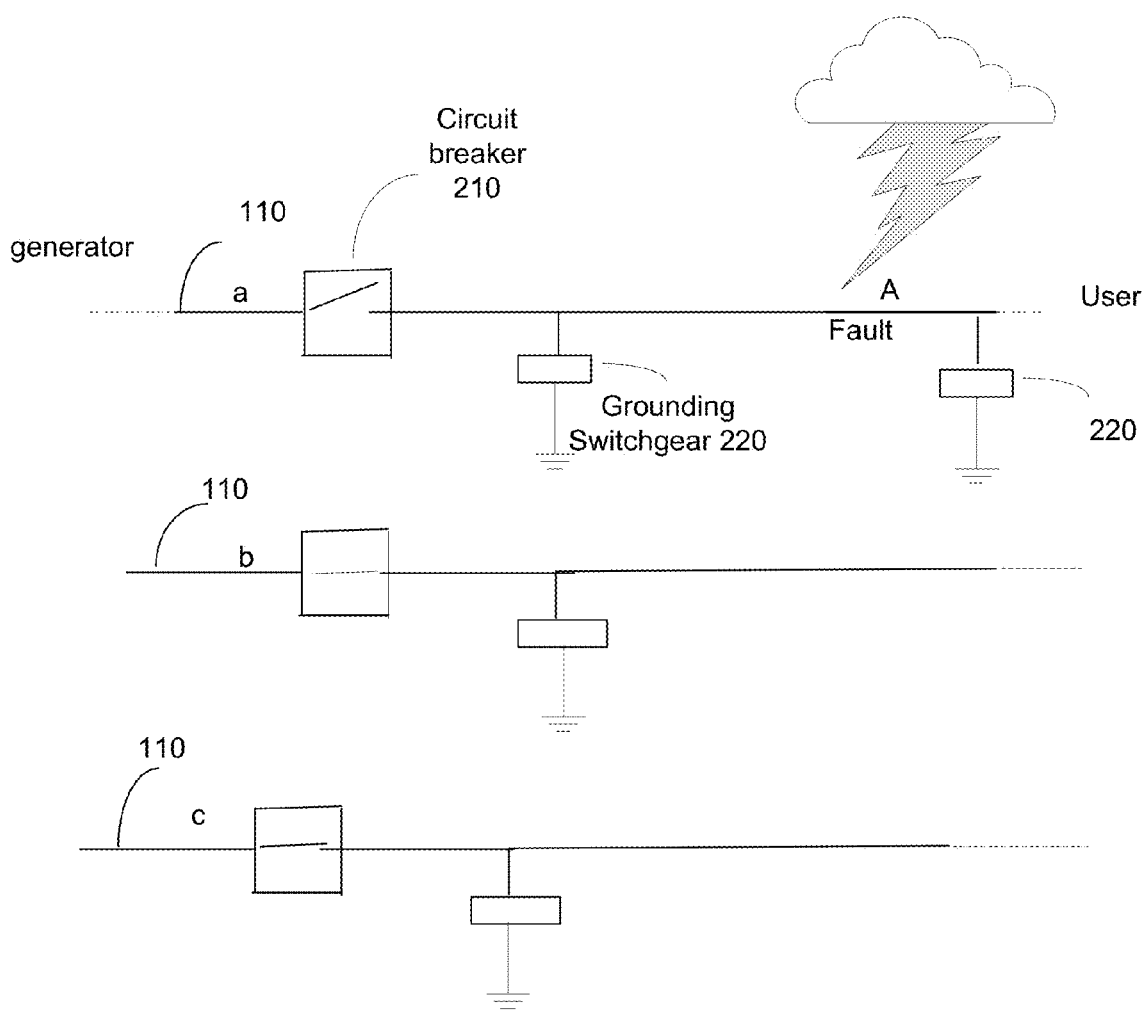
FIG. 2 is a schematic illustration of a scheme to isolate and ground a faulted section of transmission power line.

FIG. 2 shows a schematic arrangement of switch gear (e.g., circuit breakers 210 and grounding devices or switches 220) for transmission lines 110 (a, b and c) that carry three phase power from an electricity generator to a user.

Circuit breakers 210 may be of a type that can open and close on fault currents. A suitable circuit breaker 210 may be an open air isolator switch or a switch insulated by some other substance (e.g., oil, vacuum, gas, pressurized gas such as sulfur hexafluoride gas (SF6)). Suitable circuit breakers 210 may be rated by their ability to interrupt fault currents, which may surge to many hundreds or thousands of amps, and to quench the arc that may develop when circuit breaker contacts open. A typical circuit breaker may be able to terminate all current flow very quickly (e.g., between 30 ms and 150 ms) and automatically attempt to reclose.

Most frequent faults on high voltage overhead lines are single-phase-to-ground faults. Accordingly, circuit breakers 210 may be arranged to allow a single pole of a three-phase line to trip, instead of tripping all three poles. For some classes of faults this may improve system stability and availability. Further, most faults are transient; for example, lightning induced faults (e.g., fault at location A, FIG. 2). Automated reclosers (not shown) may attempt to reclose circuit breakers 210 automatically in order to clear the fault. After the preset number of attempted reclosings, circuit breaker 210 may lock out leaving the faulted section of line 110a isolated for manual intervention for fault clearing.

After ground fault A is first isolated by circuit breaker 210's single pole switching in response to a fault, the initial fault current (primary arc) on line 110a changes its state to an intermittent, unstable current with lower amplitude (secondary arc). The secondary arc may be supplied energy by the healthy phase lines (e.g., 110 b and c) through inductive and capacitive coupling. The secondary arc may extinguish within the dead time of the single pole reclosing. However, the secondary arc can have a long duration, which endangers successful reclosing of circuit breaker 210.

To overcome the effects of secondary arcs, system 200 may include grounding switches 220 that are arranged to ground faulted line 110*a* in order to sink secondary arc currents. Grounding switches 220 may ground line 110*a* only temporarily, for example, between the opening and reclosing of circuit breaker 210, to sink secondary arc currents to clear faults, and thereby encourage successful reclosing of circuit breaker 210. For this purpose, grounding switches 220 may be fast acting or high speed gas insulated switch gear devices, for example, of the type described in Kenji Annou et al. U.S. Pat. No. 5,638,524 and Watanabe et al. U.S. Pat. No. 5,543,597, both of which are incorporated by reference in their entireties herein.

Further, approaches herein for clearing faults in electrical power delivery systems involve schemes for automatically grounding an entire length or section of a power transmission line in response to a fault or anticipated fault in or on the section. In one such approach shown in FIG. 3, a fault or anticipated fault A on a power transmission line 110*a* may be segregated or isolated by temporarily crowbaring a section 110*a'* of line 110*a* to respective grounds (e.g., 318 and 318') or respective termination points (e.g., 314 and 314') at two different sites on either side of the fault or anticipated fault.

A crowbar arrangement 310 including a suitably located pair of grounding switches 312 may be used for the grounding, terminating or crowbaring action. Adjoining sections of line 110*a* that are upstream and downstream of faulted section 110*a'* may remain in electrical continuity as the grounding or crowbaring action need not involve circuit breaking actions. However, the grounding, terminating or crowbaring action may be expected to raise local ground voltage to that of faulted section 110*a'*, and consequently eliminate or reduce any voltage drop and arcing across fault A. The grounding, terminating, or crowbaring action may be reversed soon afterwards, for example, in the expectation that fault A has cleared. The reversal of grounding or crowbaring action may be implemented by reopening grounding switches 312 one or a few power cycles after the switches are closed. The reopening of grounding switches 312/crowbar 310 may be set to occur at or about voltage zero-crossings on line 110*a*.

Figure 3:
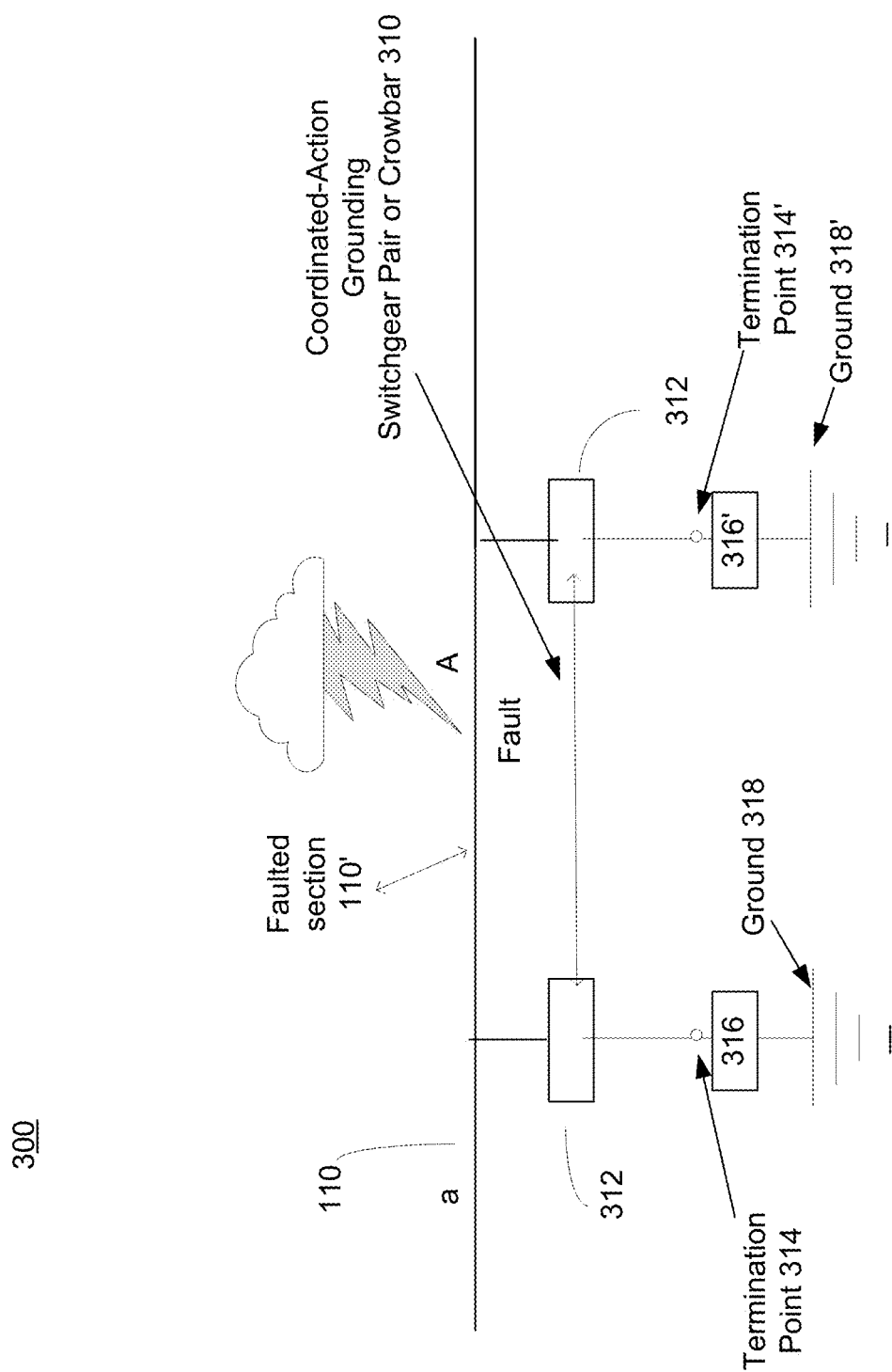
FIG. 3 is a schematic illustration of a scheme to ground a faulted section of transmission power line while maintaining electrical and physical continuity of the line, in accordance with the principles of the solutions described herein.

With reference to FIG. 3, it will be understood that respective grounds (318 and 318') may correspond to different ground potential values at the two different sites. Further, the potentials at respective termination points (314 and 314') may be adjustable relative to local ground potential by optional termination elements (e.g., 316 and 316', respectively) disposed between the termination points and the grounds at the two different sites on either side of the fault. One or both of termination elements 316 and 316' may, for example, be configured to provide user-adjustable termination point potentials. Use of such termination elements (e.g., user-adjustable capacitances or EMF sources) may allow control of the potential difference across a crowbared or terminated line section and/or control over the direction of charge flow out of the grounded or terminated line section (e.g., faulted or anticipated fault section 110*a'*).

FIG. 4 shows exemplary components of a system 400 for crowbaring faulted sections of a power transmission line in a power delivery network (e.g., system 100). System 400 includes a plurality of grounding switches 420, which may be coupled to fault sensing network 410. System 400 also may include a controller 430 configured to coordinate operation of the plurality of grounding switches 420 to, for example, synchronously or substantially simultaneously, ground or terminate both ends of a faulted section of the power transmission line.

Fault sensing network 410 includes one or more sensors (e.g., ammeters, voltammeters, magnetometers, optical sensors, lightning detectors, insulator flashover detectors, digital protective relays, etc.) arranged to detect and/or locate faults or possible faults on power transmission lines. Exemplary fault detection and location system for power transmission and distribution lines and locating are described, for example, in Kejeriwal et al. U.S. Pat. No. 5,343,155, and Elkateb et al. U.S. Pat. No. 4,390,835, Bjorklun et al. U.S. Pat. No. 5,903,155, and Borchert, et al. U.S. Pat. No. 6,822,457, all of which are incorporated by reference herein in their entireties. Fault sensing network 410 may be a part of a larger network monitoring arrangement that monitors the environment, behavior, status, quality, and/or performance of a power transmission network and its components (e.g., transformers, lines, towers, insulators, switch gear, weather conditions, lightning strikes, loading, etc.). Fault sensing network 410 may be configured to identify a fault by detecting a fault current. Further, fault sensing network 410 may be configured to detect an impending fault by measuring, for example, fault precursors (e.g., rising voltages, rising fields, leakage currents across insulator, impending lightning strikes etc.). Fault sensing network 410 also may include processors and algorithms for predicting fault occurrence (in time and space) based, for example, on temporal line events (e.g., loading, switching, current and voltage values, environmental and/or weather events etc.) and line characteristics (e.g., line/insulator physical and mechanical properties, environment and/or weather conditions, etc.).

Fault sensing network 410 may provide signals and data directly to grounding switches 420 or via other suitable mechanical, optical and/or electrical interfaces (e.g., via optional controller 430).

Grounding switches 420 may include suitable line grounding switches (e.g., grounding devices 220, 312) disposed at suitable locations and spacing through out power delivery network. The line grounding switches may, for example, include a mechanical switch, an electro-mechanical switch, a solid state switch, an SCR, an IGBT, a thyristor, an optoelectronic switch, an Austin switch, a photo-activated switch, a crossed-field switch, a gas-based switch, and/or a vacuum-based switch. The line grounding switches may be fast acting switches that are capable of switching actions, for example, on a power cycle or sub-cycle time scales.

In an implementation of system 400, the line grounding switches may be disposed, for example, at nodes in the network or at any suitable intranodal distances for sectionalizing a power line in workable or practical segments or lengths. The line grounding switches may, for example, be disposed at or proximate to a set of transmission line towers in the power delivery network so that the power line can be sectionalized in a discrete lengths corresponding to one or more inter-tower distances. The plurality of grounding switches may be configured so that an appropriate pair of grounding switches 420 responds to a detected or anticipated fault in a section of the power line (e.g., 110*a'*) by automatically closing and grounding both ends of the section. The pair of grounding switches 420 may be configured to synchronously or substantially simultaneously close and ground both ends of the section. Grounding or terminating both ends of the section may be expected to raise a local ground voltage to substantially that of the section of the live power line. This action may reduce or eliminate voltage drop and arcing across a fault in the section.

The grounding switches 420 may be further configured to reopen and un-ground the faulted section after a suitable time interval to clear the fault. Grounding switches 420 may be configured to maintain the electrical and/or physical continuity of line (e.g., 110*a*) during the closing and reopening operations.

Optional controller/processor 430 may be configured to coordinate the operation of grounding switches 420 in response to fault sensing network 410 signals and/or data. Optional controller/processor 430 may include any suitable arrangement of electromagnetic, electrical, magnetic, optical and other types of devices or elements (e.g., relays, interface circuits, network connections, data and signal processing units, address/data bus, memory devices, microprocessor, microcontroller, digital signal processor, specialized mathematical processor, and/or any other type of computing device, etc.). It will be understood that the various system 400 components (fault sensing network 410, grounding switches 420 and controller 430) may be physically coupled and integrated so that parts of a component may be shared with other components and or disposed in common units. For example, fault sensing network 410 and grounding switches 420 may share or use common line current sensing devices.

Further, all components of system 400 may be coupled to or integrated with common control systems deployed for managing electrical power transmission networks (e.g., Supervisory Control And Data Acquisition (SCADA) systems).

FIG. 5 is a flow diagram showing exemplary steps in a method 500 for clearing faults in a power transmission network. Method 500 includes detecting, anticipating or predicting a power line fault and its location (510), and then grounding both ends of a "faulted" section of the line containing the fault or putative fault (520) while preserving power line continuity. Method 500 further includes reversing the grounding of the faulted section to restore power line operation for fault clearance (530).

In the following detailed description, reference is made to the accompanying drawings, which form a part hereof. In the drawings, similar symbols typically identify similar components, unless context dictates otherwise. The illustrative embodiments described in the summary, detailed description, drawings, and claims are not meant to be limiting. Other embodiments may be utilized, and other changes may be made, without departing from the spirit or scope of the subject matter presented here. Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.). Further, those skilled in the art will recognize that the mechanical structures disclosed are exemplary structures and many other forms and materials may be employed in constructing such structures.

In a general sense, those skilled in the art will recognize that the various embodiments described herein can be implemented, individually and/or collectively, by various types of electro-mechanical systems having a wide range of electrical components such as hardware, software, firmware, or virtually any combination thereof; and a wide range of components that may impart mechanical force or motion such as rigid bodies, spring or torsional bodies, hydraulics, and electro-magnetically actuated devices, or virtually any combination thereof. Consequently, as used herein "electro-mechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs. Those skilled in the art will also appreciate that examples of electro-mechanical systems include but are not limited to a variety of consumer electronics systems, as well as other systems such as motorized transport systems, factory automation systems, security systems, and communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems for generation, transmission and distribution of electrical power, a communications system (e.g., a networked system, a telephone system, a Voice over IP system, wired/wireless services, etc.).

One skilled in the art will recognize that the herein described components (e.g., steps), devices, and objects and the discussion accompanying them are used as examples for the sake of conceptual clarity and that various configuration modifications are within the skill of those in the art. Consequently, as used herein, the specific exemplars set forth and the accompanying discussion are intended to be representative of their more general classes. In general, use of any specific exemplar herein is also intended to be representative of its class, and the non-inclusion of such specific components (e.g., steps), devices, and objects herein should not be taken as indicating that limitation is desired.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A three phase electrical power system, comprising:
    a three phase power transmission line network, including one or more transmission lines having at least three conductors for carrying electrical power;
    a sensor network in communication with at least one transmission line and arranged to detect one or more faults on the transmission line, wherein the sensor network includes circuitry configured to predict a line fault and a location of the line fault;
    a circuit breaker electrically coupled to one of the three conductors; a grounding switch coupled to the conductor having the circuit breaker of the three conductors; and
    a controller receiving information from the sensor network and configured to control the switching of the grounding switch in response to the information in order to effectuate reclosing of the circuit breaker.

2. The system of claim 1, wherein the sensor network includes a circuit configured to measure power line characteristics including voltages, currents, phases and/or frequencies.

3. The system of claim 1, wherein the sensor network includes circuitry configured to detect and locate a line fault and/or an impending line fault.

4. The system of claim 3, wherein the circuitry is configured to predict a line fault and its location based at least in part on rising line voltages or currents, rising fields, and/or leakage currents across an insulator.

5. The system of claim 1, wherein the circuitry is configured to predict the line fault and its location based on line events and line characteristics.

6. The system of claim 1, wherein the circuitry is configured to predict the line fault and its location based on line events and line characteristics between the first and second ends of the section.

7. The system of claim 1, wherein the circuitry is configured to predict the line fault and its location based on line events and line characteristics outside the first and second ends of the section.

8. The system of claim 1, wherein the circuitry is configured predict a line fault and its location based on values of line voltages or currents, proximate electromagnetic fields, and/or leakage currents across an insulator.

9. The system of claim 1, wherein the circuitry is configured to predict a line fault and its location based on environmental events or anticipated events proximate to the transmission line.

10. A method, comprising:
    detecting one or more faults on a transmission line with one or more devices in a sensor network; receiving information related to a fault from the sensor network;
    sending a signal to affect the switching of a circuit breaker in response to the information to open the circuit of one conductor of a three phase power transmission line;
    opening a ground switch in response to the information;
    reclosing the ground switch; and
    reclosing the circuit breaker.

11. A system, comprising:
    a means for detecting one or more faults on a transmission line with one or more devices in a sensor network;
    a means for receiving information related to a fault from the sensor network;
    a means for sending a signal to affect the switching of a circuit breaker in response to the information to open the circuit of one conductor of a three phase power transmission line;
    a means for opening a ground switch in response to the information;
    a means for reclosing the ground switch; and
    a means for reclosing the circuit breaker.

12. The system of claim 11, wherein the means for detecting includes a circuit configured to measure power line characteristics including voltages, currents, phases and/or frequencies.

13. The system of claim 11, wherein the means for detecting includes circuitry configured to detect and locate a line fault and/or an impending line fault.

14. The system of claim 13, wherein the circuitry is configured to predict a line fault and its location based at least in part on rising line voltages or currents, rising fields, and/or leakage currents across an insulator.

15. The system of claim 11, wherein the means for detecting includes circuitry configured to predict a line fault and its location.

16. The system of claim 15, wherein the circuitry is configured to predict the line fault and its location based on line events and line characteristics.

17. The system of claim 15, wherein the circuitry is configured to predict the line fault and its location based on line events and line characteristics between the first and second ends of the section.

18. The system of claim 15, wherein the circuitry is configured to predict the line fault and its location based on line events and line characteristics outside the first and second ends of the section.

19. The system of claim 15, wherein the circuitry is configured predict a line fault and its location based on values of line voltages or currents, proximate electromagnetic fields, and/or leakage currents across an insulator.

20. The system of claim 15, wherein the circuitry is configured to predict a line fault and its location based on environmental events or anticipated events proximate to the transmission line.

* * * * *